(12) United States Patent
Bonecutter et al.

(10) Patent No.: US 12,340,984 B2
(45) Date of Patent: Jun. 24, 2025

(54) RADIO FREQUENCY POWER RETURN PATH

(71) Applicant: Applied Materials, Inc., Santa Clara, CA (US)

(72) Inventors: Luke Bonecutter, Cedar Park, TX (US); David Blahnik, Austin, TX (US); Tuan Anh Nguyen, San Jose, CA (US); Amit Kumar Bansal, Milpitas, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/941,994

(22) Filed: Jul. 29, 2020

(65) Prior Publication Data

US 2021/0032748 A1    Feb. 4, 2021

Related U.S. Application Data

(60) Provisional application No. 62/882,234, filed on Aug. 2, 2019.

(51) Int. Cl.
*H01J 37/32* (2006.01)
*C23C 16/44* (2006.01)
(Continued)

(52) U.S. Cl.
CPC .... *H01J 37/32568* (2013.01); *C23C 16/4585* (2013.01); *C23C 16/4586* (2013.01);
(Continued)

(58) Field of Classification Search
CPC .......... H01J 37/32082; H01J 37/32091; H01J 37/321; H01J 37/32174; H01J 37/32431;
(Continued)

(56) References Cited

U.S. PATENT DOCUMENTS 5,582,866 A * 12/1996 White ................. C23C 16/4412
                                                          118/728
6,221,221 B1 * 4/2001 Al-Shaikh ......... H01J 37/32577
                                                          204/298.31
(Continued)

FOREIGN PATENT DOCUMENTS

JP    2006060212 A    3/2006
JP    2009-152634 A   7/2009
(Continued)

OTHER PUBLICATIONS

International Search Report/ Written Opinion issued to PCT/US2020/043982 on Oct. 30, 2020.
(Continued)

*Primary Examiner* — Kurt Sweely
(74) *Attorney, Agent, or Firm* — Patterson + Sheridan, LLP

(57) ABSTRACT

Embodiments presented herein are directed to radio frequency (RF) grounding in process chambers. In one embodiment, a dielectric plate is disposed between a chamber body and a lid of a process chamber. The dielectric plate extends laterally into a volume defined by the chamber body and the lid. A substrate support is disposed in the volume opposite the lid. The substrate support includes a support body disposed on a stem. The support body includes a central region and a peripheral region. The peripheral region is radially outward of the central region. The central region has a thickness less than a thickness of the peripheral region. A flange is disposed adjacent to a bottom surface of the peripheral region. The flange extends radially outward from an outer edge of the peripheral region. A bellows is disposed on the flange and configured to sealingly couple to the dielectric plate.

20 Claims, 7 Drawing Sheets

(51) Int. Cl.
*C23C 16/458* (2006.01)
*C23C 16/505* (2006.01)

(52) U.S. Cl.
CPC .. *H01J 37/32174* (2013.01); *H01J 37/32577* (2013.01); *H01J 37/32715* (2013.01); *C23C 16/4409* (2013.01); *C23C 16/505* (2013.01); *H01J 37/32082* (2013.01); *H01J 37/32091* (2013.01); *H01J 37/32513* (2013.01)

(58) Field of Classification Search
CPC ............. H01J 37/3244; H01J 37/32449; H01J 37/32458; H01J 37/32495; H01J 37/32513; H01J 37/32568; H01J 37/32577; H01J 37/32623; H01J 37/32633; H01J 37/32642; H01J 37/32651; H01J 37/32715; H01J 37/32714; C23C 16/4409; C23C 16/4412; C23C 16/45517; C23C 16/45565; C23C 16/45591; C23C 16/4584; C23C 16/4585; C23C 16/4586; C23C 16/505; C23C 16/509; H01L 21/67069; H01L 21/67751; H01L 21/68764; H01L 21/68785; H01L 21/68792

See application file for complete search history.

(56) References Cited

U.S. PATENT DOCUMENTS

| | | | | |
|---|---|---|---|---|
| 7,008,484 | B2* | 3/2006 | Yim | H01J 37/32082 156/345.33 |
| 8,404,598 | B2* | 3/2013 | Liao | H01J 37/32165 216/68 |
| 8,771,538 | B2* | 7/2014 | Lubomirsky | H01J 37/32357 315/111.41 |
| 2001/0035132 | A1* | 11/2001 | Kent | H01J 37/32431 118/733 |
| 2004/0159286 | A1* | 8/2004 | Aoki | H01J 37/32633 118/723 E |
| 2006/0060302 | A1* | 3/2006 | White | H01J 37/32174 118/723 R |
| 2010/0089319 | A1 | 4/2010 | Sorensen et al. | |
| 2011/0031216 | A1 | 2/2011 | Liao et al. | |
| 2012/0211354 | A1* | 8/2012 | Rasheed | H01J 37/34 204/192.25 |
| 2013/0319854 | A1 | 12/2013 | Parkhe et al. | |
| 2014/0302256 | A1* | 10/2014 | Chen | C23C 16/46 118/500 |
| 2018/0096865 | A1 | 4/2018 | Lubomirsky | |
| 2019/0001810 | A1 | 6/2019 | Patel et al. | |
| 2019/0177848 | A1 | 6/2019 | Chen et al. | |
| 2019/0181028 | A1 | 6/2019 | Patel et al. | |

FOREIGN PATENT DOCUMENTS

| | | | |
|---|---|---|---|
| JP | 2014509351 | A | 4/2014 |
| JP | 2014098202 | A | 5/2014 |
| JP | 2016136522 | A | 7/2016 |
| TW | 201239944 | A | 10/2012 |
| TW | 201824334 | A | 7/2018 |

OTHER PUBLICATIONS

Chinese Office Action dated Jul. 27, 2024 for Application No. 202080069816.3.
Japanese Office Action dated Jul. 30, 2024 for Application No. 2022-506138.
Taiwanese Written Opinion and Search Report dated May 30, 2024 for Application No. 109125993.
Taiwanese Search Report dated Oct. 8, 2024 for Application No. 109125993 in 7 pages.
Chinese Office Action dated Apr. 12, 2024 re: Patent Application No. 202080069816.3.
Search Report dtd Jan. 2, 2024 for SG 11202200826Y.
Chinese Office Action Dated Feb. 4, 2025 re: Chinese Patent Application No. 202080069816.3.
Japanese Office Action Dated Feb. 21, 2025 re Japanese Patent Application No. 2022-506138.
Tawian Office Action Dated Mar. 21, 2025 re:Taiwanese Patent Application No. 109125993.

* cited by examiner

RADIO FREQUENCY POWER RETURN PATH

CROSS-REFERENCE TO RELATED APPLICATIONS

This application claims priority to U.S. Provisional Patent Application No. 62/882,234, filed Aug. 2, 2019, which is hereby incorporated by reference in its entirety.

BACKGROUND

Field

Embodiments of the present disclosure generally relate to an apparatus and, more specifically, to an apparatus for facilitating deposition of uniform thickness films on a substrate.

Description of the Related Art

Chemical vapor deposition (CVD) and plasma enhanced CVD (PECVD) are processes used to deposit a film on a substrate, such as a semiconductor substrate. CVD is generally accomplished by introducing process gases into a process chamber that contains the substrate therein. The process gases are directed through a gas distribution assembly and into a process volume in the process chamber. The gas distribution assembly is disposed in the process volume opposite the substrate which is positioned on a pedestal.

Radio frequency (RF) power may be used to activate the process gases in the process chamber. The RF power has a tendency to return to the source. In some cases, arcing can occur from the RF power in the process chamber which can damage the chamber and components thereof. A ground path is provided to direct the RF power away from components of the process chamber to prevent damage thereto and attempt to reduce an occurrence of arcing in the process chamber. However, current ground path designs are complicated and enable arcing to occur in the process chamber.

Thus, an improved RF return path design is needed.

SUMMARY

In one embodiment, an apparatus is provided which includes a chamber body and a lid defining a volume therein. A dielectric plate is disposed between the chamber body and the lid. The dielectric plate extends laterally into the volume. A substrate support is disposed in the volume opposite the lid. The substrate support includes a support body disposed on a stem. The support body includes a central region and a peripheral region radially outward of the central region. The central region has a thickness less than a thickness of the peripheral region. The substrate support also includes a flange adjacent to a bottom surface of the peripheral region. The flange extends radially outward of an outer edge of the peripheral region. A bellows is disposed on the flange and configured to sealingly couple to the dielectric plate.

In another embodiment, an apparatus is provided which includes a chamber body and a lid defining a volume therein. A dielectric plate is disposed between the chamber body and the lid. The dielectric plate extends laterally into the volume. A channel is formed through the lid adjacent to the dielectric plate. The channel surrounds at least a portion of the volume. A substrate support is disposed in the volume opposite the lid. The substrate support includes a support body disposed on a stem. The support body includes a central region and a peripheral region radially outward of the central region. The central region has a thickness less than a thickness of the peripheral region. A flange is disposed adjacent to a bottom surface of the peripheral region. The flange extends radially outward of an outer edge of the peripheral region. A bellows is disposed on the flange and configured to sealingly couple the flange to the dielectric plate.

In yet another embodiment, an apparatus is provided which includes a chamber body and a lid defining a volume therein. A dielectric plate is disposed between the chamber body and the lid. The dielectric plate extends laterally into the volume. A channel is formed through the lid adjacent to the dielectric plate. The channel surrounds at least a portion of the volume. A substrate support is disposed in the volume opposite the lid. The substrate support includes a support body disposed on a stem. The support body includes a central region and a peripheral region radially outward of the central region. The central region has a thickness less than a thickness of the peripheral region. A flange is disposed adjacent to a bottom surface of the peripheral region. The flange extends radially outward of an outer edge of the peripheral region. A bellows is disposed on the flange. The bellows is coupled to the flange and the plate. An opening is formed through the bellows. The opening is sealed closed when the bellows is compressed.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, as the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments presented herein are directed to radio frequency (RF) grounding in process chambers. In one embodiment, a dielectric plate is disposed between a chamber body and a lid of a process chamber. The dielectric plate extends laterally into a volume defined by the chamber body and the lid. A substrate support is disposed in the volume opposite the lid. The substrate support includes a support body disposed on a stem. The support body includes a central region and a peripheral region. The peripheral region is radially outward of the central region. The central region has a thickness less than a thickness of the peripheral region. A flange is disposed adjacent to a bottom surface of the peripheral region. The flange extends radially outward from an outer edge of the peripheral region. A bellows is disposed on the flange and configured to sealingly couple to the dielectric plate.

Figure 1:
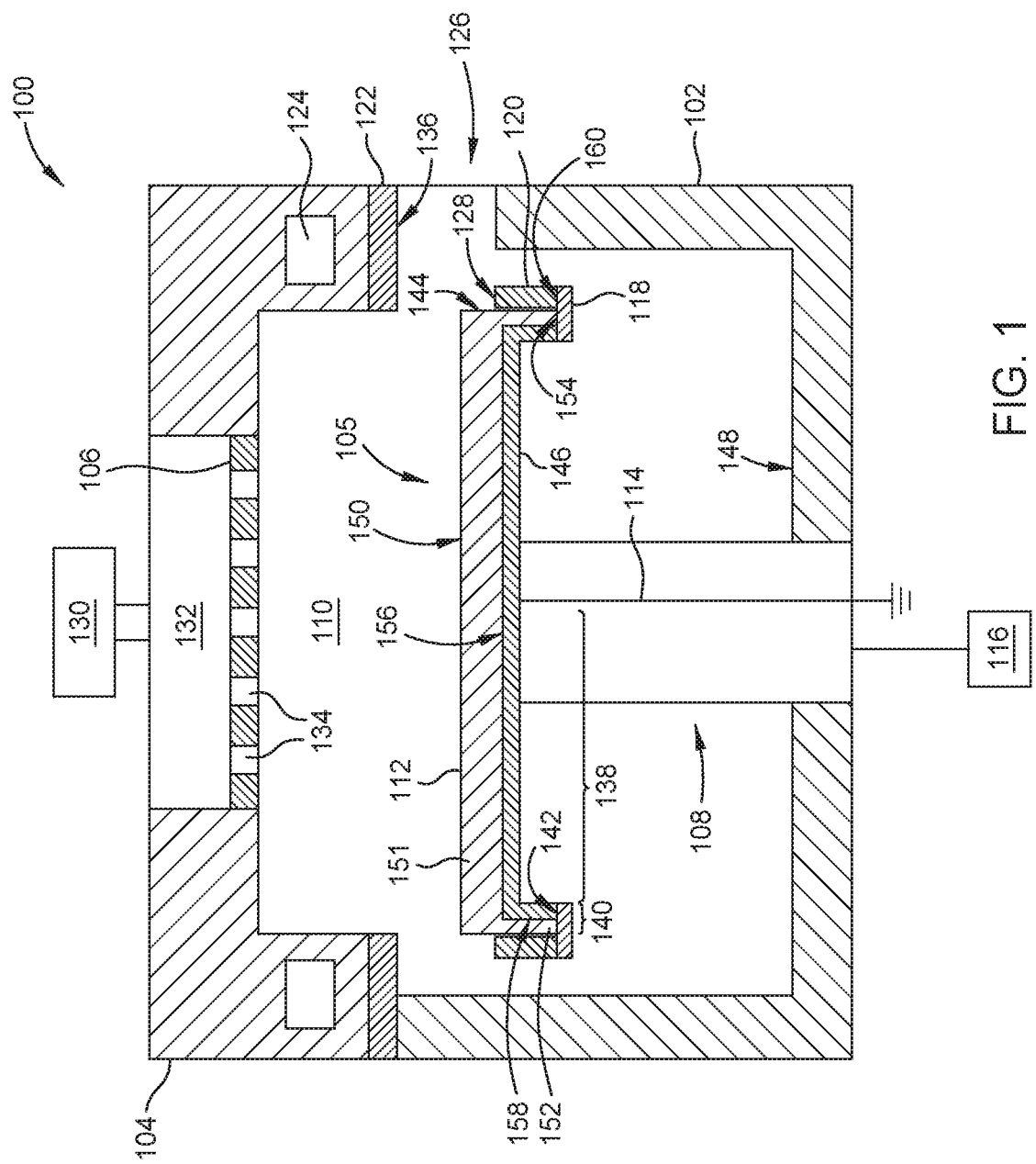
FIG. 1 illustrates a schematic cross-sectional view of a process chamber, according to one embodiment.

FIG. 1 illustrates a schematic cross-sectional view of a process chamber 100, according to one embodiment. The process chamber 100 includes a chamber body 102 and a lid 104 disposed on the chamber body 102. The chamber body 102 and the lid 104 define a volume 110 therein. A bottom 148 of the chamber body 102 faces the lid 104.

The lid 104 includes a faceplate 106 with a plurality of holes 134 formed therethrough. A gas source 130 is coupled to the lid 104. A gas from the gas source 130 flows into a plenum 132 defined at least partially by the lid 104 and the faceplate 106. The plenum 132 is in fluid communication with the volume 110 via the plurality of holes 134. The plurality of holes 134 through the faceplate 106 enables a substantially uniform distribution of the gas into the volume 110.

A substrate support 105 (e.g., a pedestal) is disposed in the volume 110 opposite the lid 104. The substrate support 105 includes a support body 112 and a stem 108. The stem 108 extends laterally through the bottom 148 of the chamber body 102. The stem 108 is substantially normal to the bottom 148. A support surface 150 of the support body 112 faces the lid 104. The bottom 148 is substantially parallel to the faceplate 106.

The support body 112 is disposed on the stem 108. The support body 112 includes a first portion 151 and a second portion 152. The first portion 151 is substantially coaxial with the stem 108 and includes the support surface 150. The first portion 151 is substantially parallel to the faceplate 106 and the bottom 148. The second portion 152 is coupled to the first portion 151 and extends laterally from the first portion 151 toward the bottom 148. The second portion 152 is cylindrically shaped and substantially perpendicular to the first portion 151, surrounding at least a portion of the stem 108.

A bottom surface 156 of the first portion 151 faces the bottom 148 of the chamber body 102. An interior surface 158 of the second portion 152 faces the stem 108. A bottom surface 154 of the second portion 152 faces the bottom 148 of the chamber body 102. The bottom surface 154 of the second portion 152 is closer to the bottom 148 of the chamber body 102 than the bottom surface 156 of the first portion 151. In some embodiments, the support body 112 is a unitary member.

An outer surface 144 of the support body 112 is a radially outer surface of the support body 112 and faces the chamber body 102. The outer surface 144 faces away from the stem 108 and is substantially perpendicular to the bottom 148 of the chamber body 102 and the support surface 150. A ground plate 146 is coupled to the bottom surface 156 of the first portion 151 and the interior surface 158 of the second portion 152. That is, the ground plate 146 is disposed between the support body 112 and the stem 108. The ground plate 146 is fabricated from a conductive material. In another example, the ground plate 146 includes a central opening through which the stem 108 is disposed, allowing contact between the stem 108 and a bottom of the first portion 151.

A conductive rod 114 is disposed in and extends through the stem 108. The conductive rod 114 is coupled to the ground plate 146. The conductive rod 114 is also coupled to ground external to the stem 108. A bottom surface 142 of the ground plate 146 along the second portion 152 of the support body 112 is substantially parallel and coplanar with the bottom surface 154 of the second portion 152.

The substrate support 105 and the ground plate 146 include a central region 138 and a peripheral region 140. The central region 138 includes at least a part of the first portion 151. The peripheral region 140 includes at least a part of the second portion 152. Each of the central region 138 and the peripheral region 140 includes at least a portion of the support body 112 and the ground plate 146. The peripheral region 140 is radially outward of the central region 138.

A flange 118 is disposed along the bottom surface 142 of the ground plate 146 in the peripheral region 140. The flange 118 is substantially parallel to the support surface 150. The flange 118 extends along the bottom surface 142 of the ground plate 146 and the bottom surface 154 of the second portion 152. The flange 118 extends radially outward of the outer surface 144. The flange 118 can be coupled to the bottom surface 142 of the ground plate 146, the bottom surface 154 of the second portion 152, or both. The flange 118 is fabricated from a conductive material, such as a metal, for example, aluminum.

A bellows 120 is disposed on the flange 118 radially outward of the support body 112. In one example, the bellows 120 forms a circular shape which surrounds the support body 112. The bellows 120 is positioned on a top surface 160 of the flange 118. The top surface 160 is opposite the bottom 148 of the chamber body 102 and faces the lid 104. The bellows 120 is adjacent to the outer surface 144 of the support body 112 and extends laterally from the flange 118 toward the lid 104. The bellows 120 is positioned radially outward of, and optionally spaced from, the second portion 152 of the support body 112. A top surface 128 of the bellows 120 is substantially parallel to the support surface 150.

The bellows 120 includes a return path between the top surface 128 and the flange 118. The return path provides a route for radio frequency (RF) power to travel to ground. That is, the bellows 120 provides a conductive path from the top surface 128 thereof to the flange 118. The bellows 120 provides an efficient path to ground for the RF power. Advantageously, the bellows 120 is a simple design that can be easily replaced which can reduce maintenance time and associated costs. To facilitate flow of the RF power, the bellows 120 can be formed from, or include, an electrically conductive material, such as metal. In one example, the bellows 120 includes a metal sheet, a metal mesh, or metal conductors embedded in another material. In such an example, the metal can include aluminum.

A plate 122 is disposed between the lid 104 and the chamber body 102. The plate 122 is ring shaped and surrounds at least a portion of volume 110. A bottom surface 136 of the plate 122 is substantially parallel to the top surface 128 of the bellows 120. The plate 122 is fabricated from an insulative material to isolate the chamber body 102 and the lid 104. For example, the plate 122 is fabricated from a dielectric or ceramic containing material.

A channel 124 is formed through the lid 104. The channel 124 is adjacent to the plate 122 and surrounds at least a portion of the volume 110. The channel 124 can be in fluid communication with an exhaust pump (not shown). The channel 124 enables gas and particles to be removed from the volume 110 to prevent damage to, and/or contamination of, a film deposited on the substrate.

An opening 126 is formed through the chamber body 102. The opening 126 enables a substrate (not shown) to be loaded onto the support surface 150 of the substrate support 105 between the plate 122 and the chamber body 102. An actuator 116 is coupled to the stem 108 of the substrate support 105. The actuator 116 is configured to move the substrate support 105 between a lowered position and a raised position in the volume 110. As shown in FIG. 1, the substrate support 105 is disposed in the lowered position, such that the bellows 120 is not in contact with the plate 122.

During operation, the substrate support 105 is moved to the lowered position by the actuator 116. The substrate is loaded onto the support surface 150 through the opening 126. The actuator 116 moves the substrate support 105 to the raised position. In the raised position, the top surface 128 of the bellows 120 contacts the bottom surface 136 of the plate 122. A seal is created between the top surface 128 of the bellows 120 and the bottom surface 136 of the plate 122. The seal substantially prevents gas from exiting the volume 110 through the opening 126. The bellows 120 can be compressed between the plate 122 and the flange 118 when the substrate support 105 is in the raised position.

A gas is introduced into the volume 110 from the gas source 130 through the faceplate 106. Radio frequency (RF) power is used to activate the gas in the volume 110. The activated gas is used to deposit material on the substrate. A RF return path of the RF power can be through the bellows 120 to the flange 118, the ground plate 146, and the conductive rod 114 to ground. Advantageously, the RF return path can substantially reduce an occurrence of RF leakage, formation of parasitic plasma, and arcing within the volume 110.

Figure 2A:
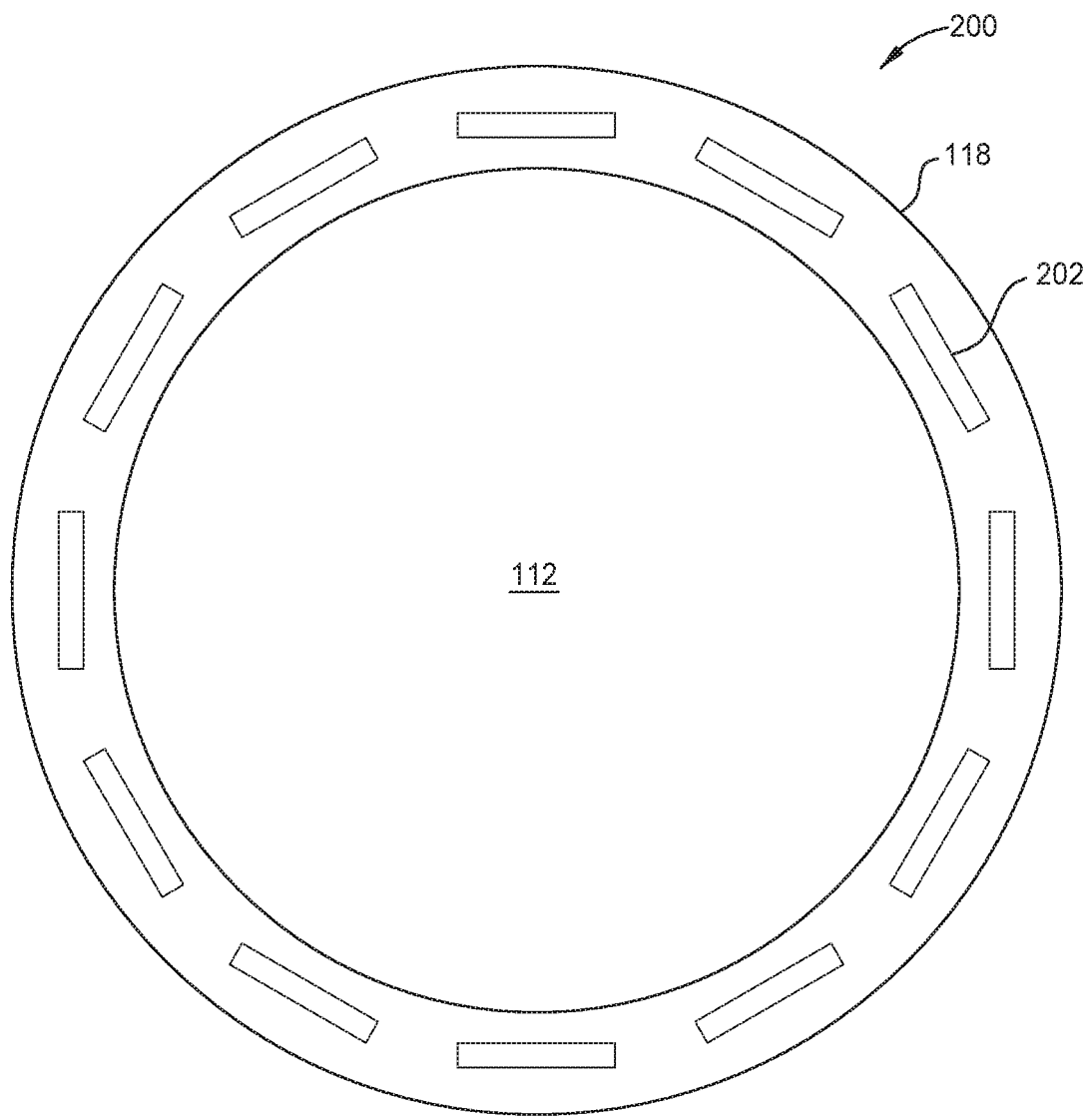
FIG. 2A illustrates a schematic top view of a grounding arrangement, according to one embodiment.

FIG. 2A illustrates a schematic top view of a grounding arrangement 200, according to one embodiment. The grounding arrangement 200 can be used as an alternative to the bellows 120 (FIG. 1). The grounding arrangement 200 includes a plurality of conductive loops 202 disposed about the support body 112. The plurality of conductive loops 202 can be disposed about the support body 112 as an alternative to the bellows 120.

The plurality of conductive loops 202 are disposed radially outward of the support body 112. Each conductive loop of the plurality of conductive loops 202 is disposed on the flange 118. As the substrate support 105 is moved into the raised position, the plurality of conductive loops 202 are compressed against the bottom surface 136 of the plate 122. The plurality of conductive loops 202 maintain the RF return path through the flange 118, the ground plate 146, and the conductive rod 114. That is, RF current flows through the plurality of conductive loops 202, to the flange 118, to the ground plate 146, and to the conductive rod 114.

Figure 2B:
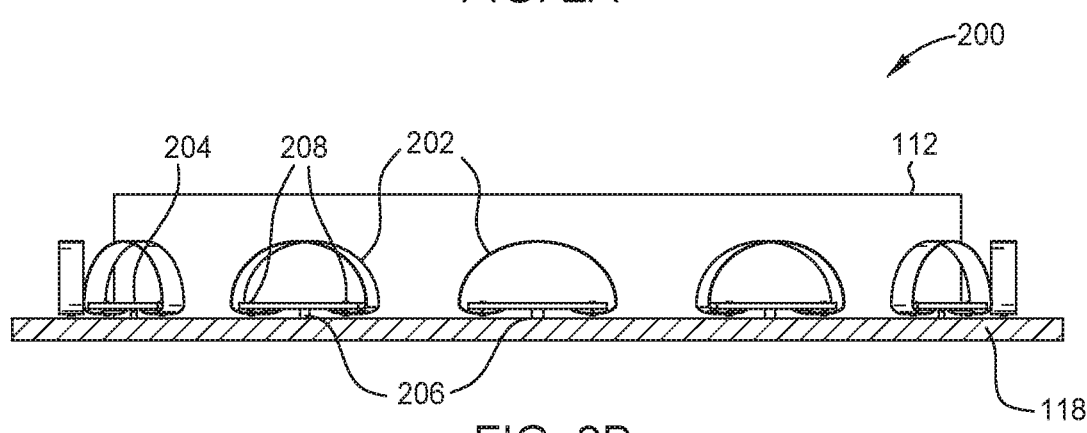
FIG. 2B illustrates a schematic side view of a grounding arrangement, according to one embodiment.

FIG. 2B is a schematic side view of the grounding arrangement 200, according to one embodiment. Ends of the conductive loops 202 are coupled to a plate 204 via a first fastener 208. Each plate 204 is coupled to the flange 118 via a second fastener 206. That is, the ends of the conductive loops 202 are disposed between and in contact with the plates 204 and the flange 118. In one embodiment, the first fasteners 208 and the second fastener 206 are fabricated from a conductive material, such as steel or another alloy. The plurality of conductive loops 202 are symmetrically disposed about the support body 112 to provide a symmetric RF return path in the process chamber 100. For example, an angular spacing between each of the plurality of conductive loops 202 is between about 20 degrees and about 60 degrees, such as about 30 degrees.

Figure 3A:
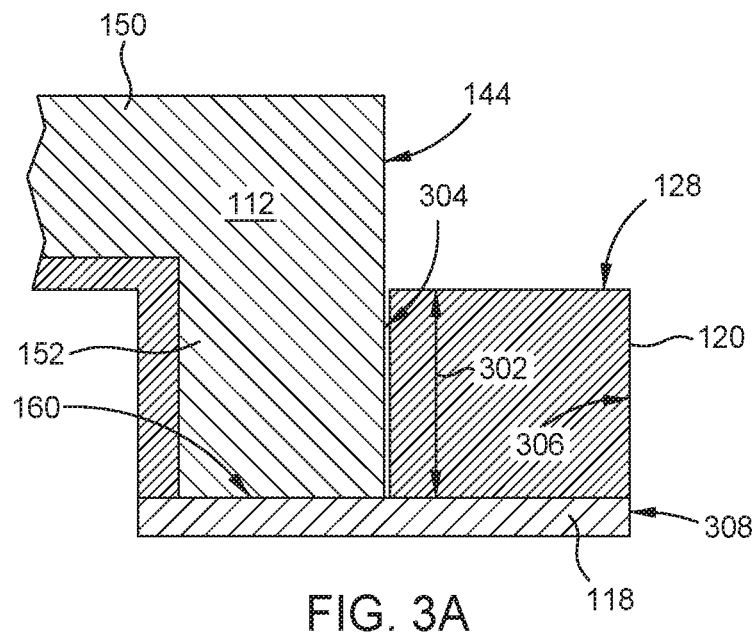
FIG. 3A illustrates a schematic cross-sectional view of a bellows, according to one embodiment.

FIG. 3A illustrates a schematic cross-sectional view of the bellows 120, according to one embodiment. The bellows 120 is adhered to the flange 118. An inner side 304 of the bellows 120 is adjacent to the outer surface 144 of the support body 112. An outer side 306 of the bellows 120 is opposite the inner side 304. The outer side 306 is substantially aligned with an outer edge of the flange 118.

As the substrate support 105 is moved to the raised position, the bellows 120 is compressed in a direction from the top surface 128 thereof to the flange 118. That is, as the bellows 120 is compressed, a height 302 of the bellows 120 decreases. As the substrate support 105 is moved to the lowered position, the height 302 of the bellows 120 increases and returns to an original height.

Figure 3B:
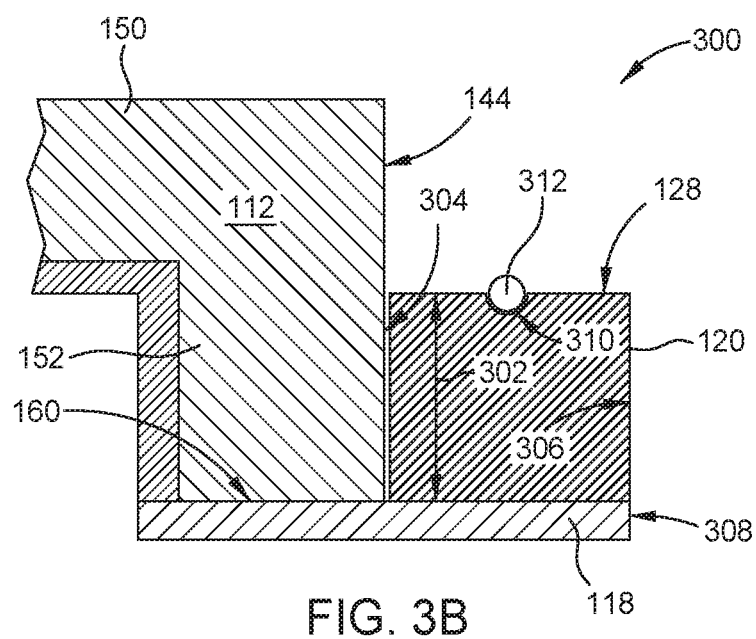
FIG. 3B illustrates a schematic cross-sectional view of a bellows arrangement, according to one embodiment.

FIG. 3B illustrates a schematic cross-sectional view of a bellows arrangement 300, according to one embodiment. The bellows arrangement 300 is similar to the bellows 120 discussed above with respect to FIGS. 1 and 3A. However, the bellows arrangement 300 in FIG. 3B includes a conductive O-ring 312 disposed along the top surface 128 of the bellows 120.

A channel 310 is formed in the top surface 128 of the bellows 120. The conductive O-ring 312 is disposed in the channel 310. At least a portion of the conductive O-ring 312 extends into the channel 310. At least a portion of the conductive O-ring 312 extends above the top surface 128 of the bellows 120.

The conductive O-ring 312 provides a conductive point on the bellows 120 through which RF current travels in the RF return path. That is, the conductive O-ring 312 enables increased flow of RF current into and through the RF return path (e.g., the bellows 120 and/or 300), as discussed above. Thus, the conductive O-ring 312 further improves RF grounding and further reduces an occurrence of parasitic plasma and arcing in the process chamber 100. In one example, the conductive O-ring 312 completely circumscribes the support body 112.

Figure 4:
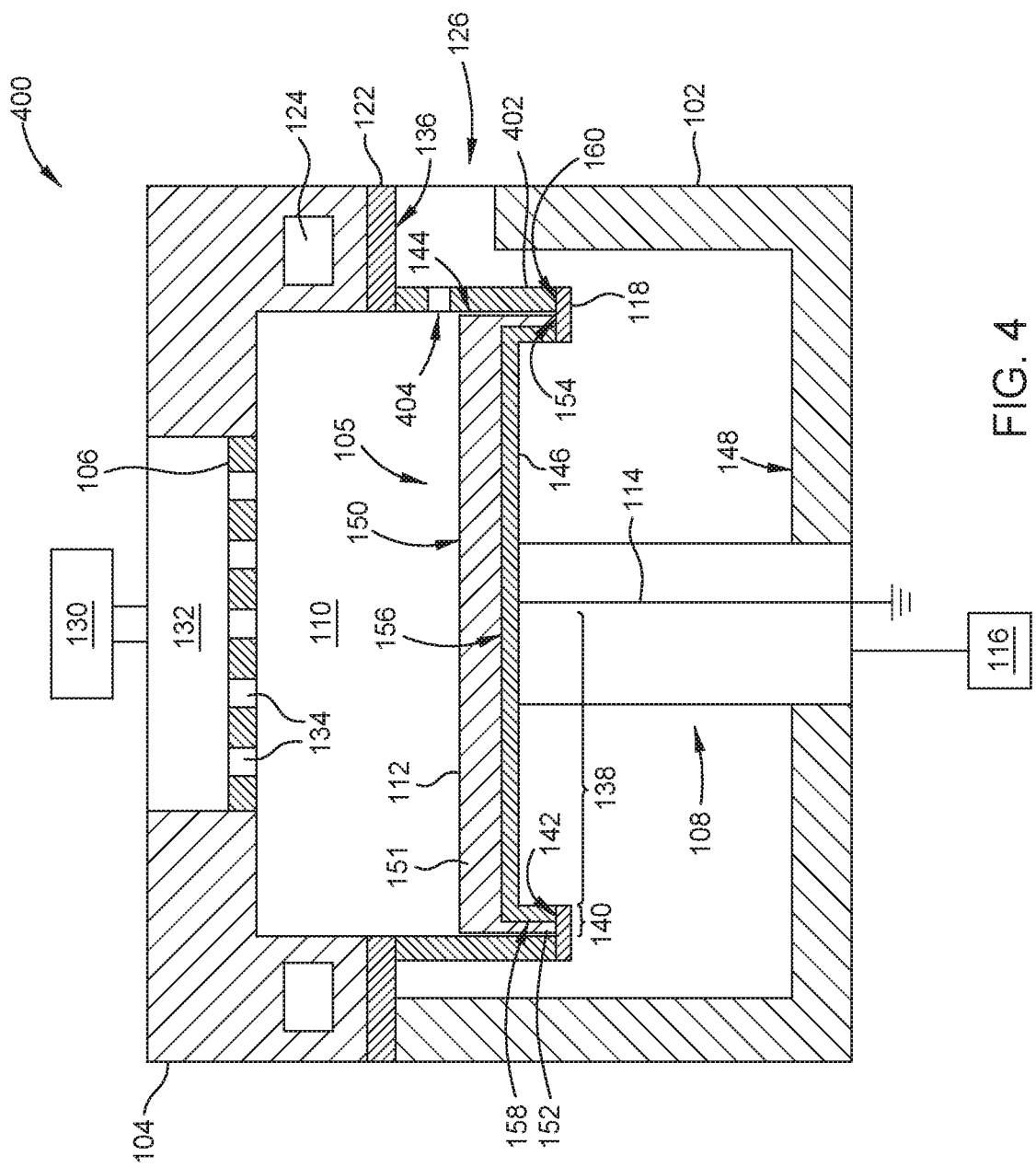
FIG. 4 illustrates a schematic cross-sectional view of a process chamber, according to one embodiment.

FIG. 4 illustrates a schematic cross-sectional view of a process chamber 400, according to one embodiment. The process chamber 400 is similar to the process chamber 100 discussed with respect to FIG. 1 in many respects. However, a bellows 402 in the process chamber 400 differs from the bellows 120 in the process chamber 100.

The bellows 402 is disposed on the flange 118 adjacent to the support body 112. However, the bellows 402 is attached to the bottom surface 136 of the plate 122. That is, the bellows 402 is adhered to the flange 118 and the bottom surface 136 of the plate 122. The bellows 402 can be adhered to the bottom surface 136 via one or more fasteners, an adhesive, or in another suitable manner.

A slit 404 is formed through the bellows 402. The slit 404 extends an angular distance that enables a substrate (not shown) to be loaded onto the support surface 150 through the slit 404. As the substrate support 105 is moved into the raised position, the bellows 402 compresses between the plate 122 and the flange 118. The slit 404 is also compressed into the bellows 402. Thus, the slit 404 is sealed when the substrate support 105 is in the raised position.

Figure 5A:
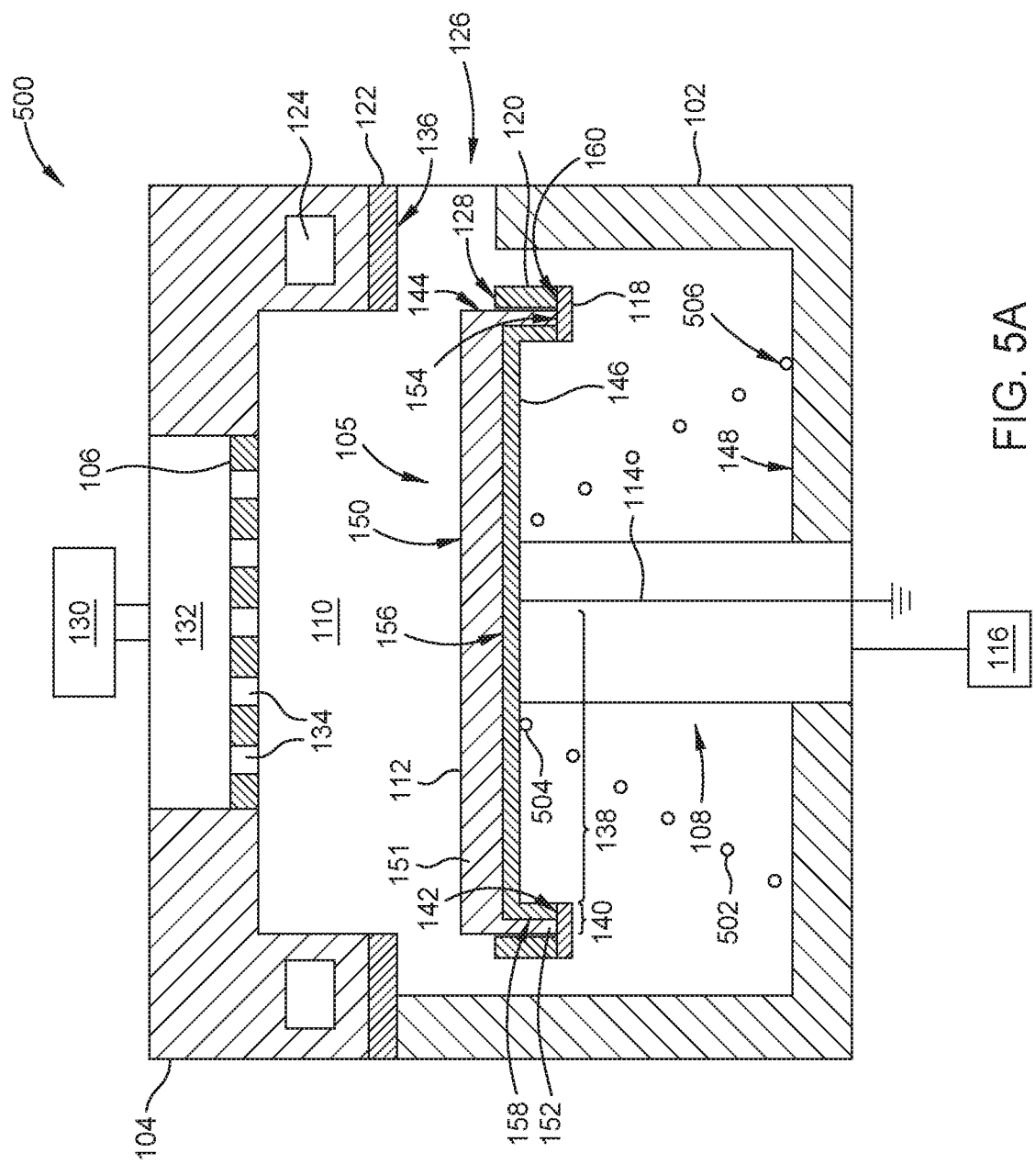
FIG. 5A illustrates a schematic cross-sectional view of a process chamber, according to one embodiment.

FIG. 5A illustrates a schematic cross-sectional view of a process chamber 500, according to one embodiment. The process chamber 500 is similar to the process chamber 100 discussed with respect to FIG. 1 in many respects. However, the process chamber 500 includes a ground strip 502 disposed in the volume 110. The ground strip 502 includes a first end 504 and a second end 506 radially outward of the first end 504.

The ground strip 502 is disposed about the stem 108. The ground strip 502 is in contact with the ground plate 146 adjacent to the stem 108. In some embodiments, which can be combined with one or more embodiments described above, the ground strip 502 is physically and electrically coupled to the ground plate 146. That is, the first end 504 of the ground strip 502 is adhered to the ground plate 146. A second end 506 of the ground strip 502 is physically and electrically coupled to the chamber body 102. In some embodiments, which can be combined with one or more embodiments described above, the second end 506 of the ground strip 502 is coupled to the bottom 148 of the chamber body 102. The second end 506 of the ground strip 502 is coupled to ground to provide a ground path for the RF power in the volume 110. When the substrate support 105 is in the lowered position, the ground strip 502 forms concentric rings, such as a coil.

As the substrate support 105 is moved to the raised position, the first end 504 of the ground strip 502 maintains contact with the ground plate 146 and is moved with the substrate support 105. However, the second end 506 of the ground strip 502 is stationary and maintains contact with the chamber body 102. That is, when the substrate support 105 is in the raised position, the ground strip 502 forms a conical shape surrounding the stem 108. The ground strip 502 provides a continuous path to ground for the RF power in the volume 110. Thus, the ground strip 502 can substantially reduce an occurrence of parasitic plasma and arcing in the process chamber 500. In one embodiment, which can be combined with one or more embodiments discussed above, the conductive rod 114 is not included, because the ground strip 502 provides a sufficient return path for the RF power.

Figure 5B:
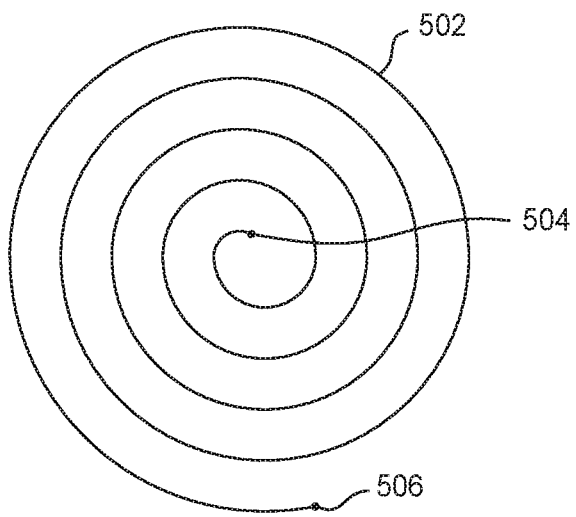
FIG. 5B illustrates a schematic top view of a ground strip, according to one embodiment.

FIG. 5B illustrates a schematic top view of the ground strip 502, according to one embodiment. The ground strip 502 is disposed in a spiral about the stem 108 (FIGS. 1, 4, and 5A). As the substrate support 105 is moved to the raised position, the ground strip 502 forms a helical shape between the substrate support 105 and the bottom 148 of the chamber body 102.

Figure 5C:
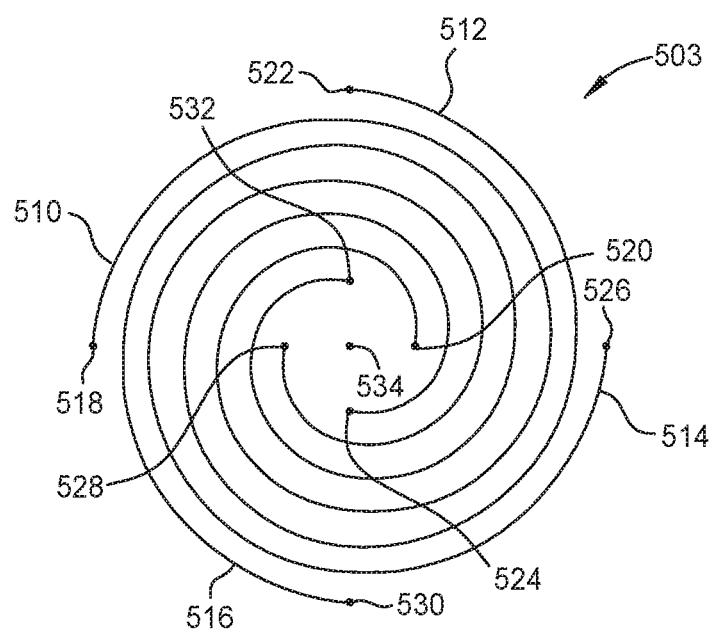
FIG. 5C illustrates a schematic top view of a ground strip, according to one embodiment.

FIG. 5C illustrates a schematic view of a ground strip 503, according to one embodiment. The ground strip 503 can be used in any portion of the disclosure wherein the ground strip 502 is described as being used. The ground strip 503 includes multiple ground paths 510, 512, 514, 516, such as a first path 510, a second path 512, a third path 514, and a fourth path 516. The multiple ground paths are intertwined about a center point 534. The center point 534 is also a center point of the stem 108 (FIGS. 1, 4, and 5A).

A first end 520, 524, 528, and 532 of each of the first, second, third, and fourth paths 510, 512, 514, and 516, respectively, is adjacent to the center point 534. The first, second, third, and fourth paths 510, 512, 514, and 516 each spiral away from the center point 534 to a second end 518, 522, 526, and 530, respectively. The first ends 520, 524, 528, and 532 are coupled to a ground plate on the substrate support, such as the ground plate 146 (FIGS. 1, 4, and 5A). The second ends 518, 522, 526, and 530 are coupled to the chamber body 102. In one example, each of the first ends 520, 524, 528, and 532 are spaced an equal angular distance from one another. Additionally or alternative, each of the second ends 518, 522, 526, and 530 are spaced an equal angular distance from one another.

The ground paths 510, 512, 514, and 516 are shorter than the ground strip 502. Thus, the ground paths 510, 512, 514, and 516 can provide an improved return path for RF power in the volume 110. The ground paths 510, 512, 514, and 516 can also further reduce an occurrence of parasitic plasma and arcing in the volume 110 because multiple return paths are provided for the RF power.

Figure 6:
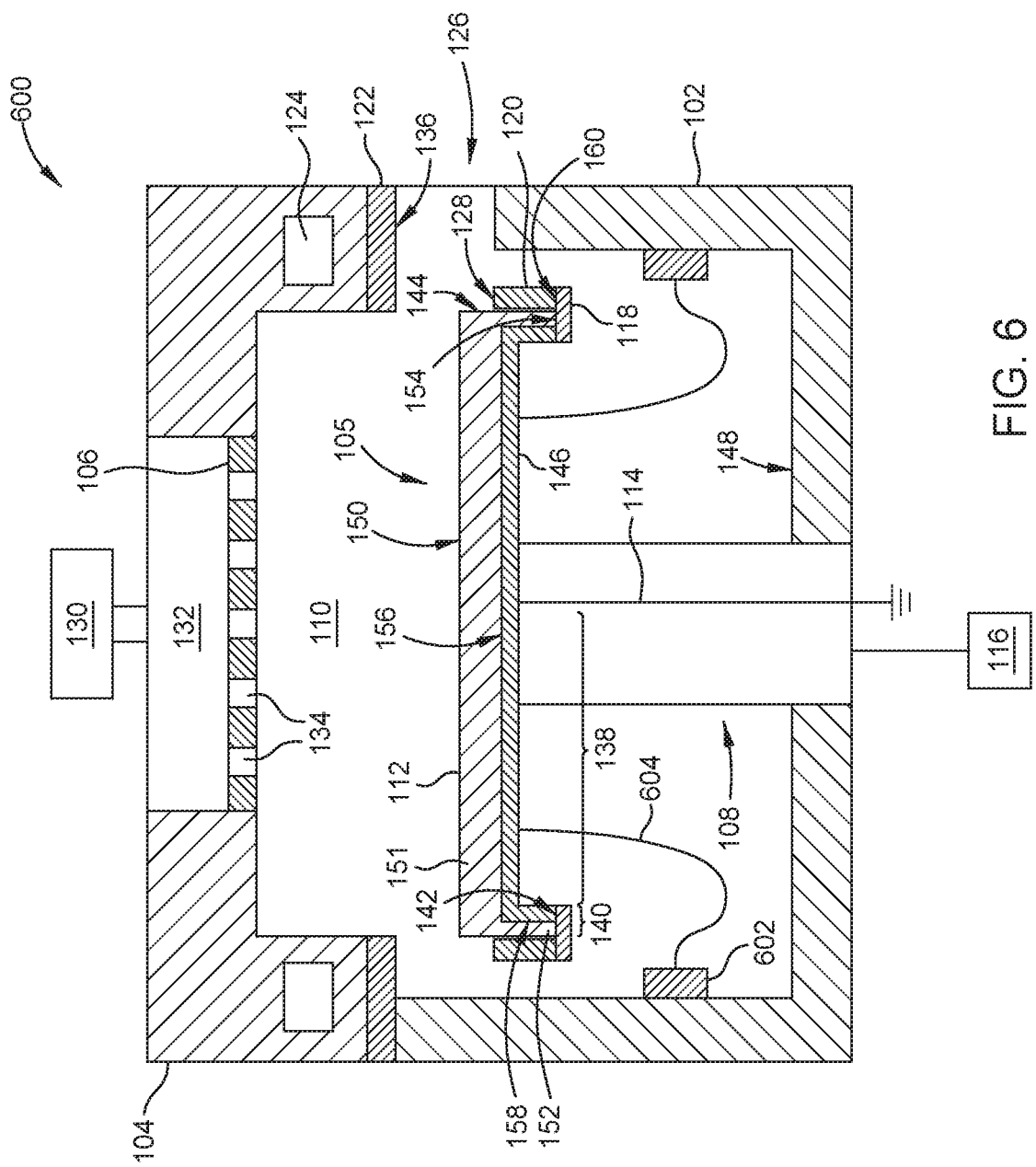
FIG. 6 illustrates a schematic cross-sectional view of a process chamber, according to one embodiment.

FIG. 6 illustrates a schematic cross-sectional view of a process chamber 600, according to one embodiment. The process chamber 600 is similar to the process chamber 100 discussed with respect to FIG. 1 in many respects. However, the process chamber 600 includes one or more ground blocks 602 and one or more ground straps 604.

The one or more ground blocks 602 are disposed on an interior surface of the chamber body 102 facing the volume 110. When the substrate support 105 is in the raised position, the one or more ground blocks 602 are disposed below the support body 112. The one or more ground straps 604 are coupled to the ground blocks 602. The one or more ground straps 604 are also coupled to the ground plate 146 of the substrate support 105. The chamber body 102 is coupled to ground.

The one or more ground straps 604 are fabricated from a flexible and conductive material, such as aluminum straps. The one or more ground straps 604 are flexible to enable constant contact with the ground plate 146 while the substrate support 105 is moved in the volume 110. The one or more ground straps 604 are conductive to provide a return path for RF power in the volume 110. The ground path is similar to that of the process chamber 100 in FIG. 1, except that the ground path travels from the ground plate 146 through the one or more ground straps 604 to the ground blocks 602 and the grounded chamber body 102. The conductive rod 114 in the stem 108 is not included in the ground path and/or the RF power path, according to one embodiment. Advantageously, the one or more ground blocks 602 and the one or more ground straps 604 provide an efficient ground path for the RF power and can result in reduced downtime and cost savings during maintenance of the process chamber 600.

While aspects herein are described with respect to a substrate support having a first portion and a second portion of different vertical thicknesses, it is contemplated that substrate supports having other dimensions, including a uniform thickness, can benefit from aspects of the disclosure.

While the foregoing is directed to embodiments of the present disclosure, other and further embodiments of the disclosure may be devised without departing from the basic scope thereof, and the scope thereof is determined by the claims that follow.

What is claimed is:

1. An apparatus, comprising:
   a chamber body and a lid defining a volume therein;
   a dielectric plate physically separating and electrically isolating the chamber body and the lid;
   a substrate support disposed in the volume opposite the lid, the substrate support comprising:
      a support body disposed on a stem, the support body including a central region and a peripheral region radially outward of the central region, the central region having a thickness less than a thickness of the peripheral region;
      a ground plate disposed between the support body and the stem; and
      a flange adjacent to a bottom surface of the peripheral region and coupled to the ground plate, the flange extending radially outward of an outer edge of the peripheral region;

a conductive rod extending through the stem, coupled to the ground plate and adapted for coupling to a ground; and a grounding arrangement disposed about the support body and coupled to the ground plate, the grounding arrangement actuatable to physically contact the dielectric plate.

2. The apparatus of claim 1, further comprising:
one or more ground blocks positioned in the volume and disposed on the chamber body; and
one or more ground straps coupled to the one or more ground blocks and the ground plate.

3. The apparatus of claim 1, wherein the grounding arrangement comprises a plurality of conductive loops.

4. The apparatus of claim 3, wherein the grounding arrangement further comprises a plate corresponding to each conductive loop of the plurality of conductive loops, one or more fasteners that couple each conductive loop to the plate, and one or more fasteners that couple each plate to the flange at a center of each plate.

5. The apparatus of claim 1, wherein the support body is constructed as a unitary member.

6. The apparatus of claim 1, wherein the ground plate is coupled to a bottom surface of the central region and a radially interior surface of the peripheral region.

7. The apparatus of claim 1, wherein the grounding arrangement is adjacent to an outer surface of the peripheral region.

8. The apparatus of claim 1, wherein at least a portion of the peripheral region extends towards a chamber bottom.

9. The apparatus of claim 1, wherein the peripheral region surrounds at least a portion of the stem.

10. An apparatus, comprising:
a chamber body and a lid defining a volume therein;
a dielectric plate physically separating and electrically isolating the chamber body and the lid;
a channel formed through the lid adjacent to the dielectric plate, the channel surrounding at least a portion of the volume;
a substrate support disposed in the volume opposite the lid, the substrate support comprising:
a support body disposed on a stem, the support body including a central region and a peripheral region radially outward of the central region, the central region having a thickness less than a thickness of the peripheral region;
a ground plate disposed between the support body and the stem; and
a flange disposed adjacent to a bottom surface of the peripheral region and coupled to the ground plate, the flange extending radially outward of an outer edge of the peripheral region;
a conductive rod extending through the stem, coupled to the ground plate and adapted for coupling to a ground; and
a plurality of conductive loops disposed on the flange and configured to physically contact the dielectric plate.

11. The apparatus of claim 10, further comprising:
one or more ground blocks positioned in the volume and disposed on the chamber body; and
one or more ground straps coupled to the one or more ground blocks and the ground plate.

12. The apparatus of claim 10, further comprising a ground strip having a first end and a second end, the first end coupled to the ground plate adjacent to the stem and the second end coupled to the chamber body.

13. The apparatus of claim 10, further comprising a plurality of ground strips, each ground strip having a first end and a second end, wherein:
each of the first ends are coupled to the ground plate adjacent to the stem, and
each of the second ends are coupled to the chamber body.

14. The apparatus of claim 10, further comprising a plurality of plates with each plate corresponding to one conductive loop of the plurality of conductive loops, one or more fasteners that couple each of the conductive loops to each of the plates, and one or more fasteners that couple each of the plates to the flange at a center of each plate.

15. The apparatus of claim 10, wherein the channel is configured to remove gases from the volume.

16. The apparatus of claim 10, wherein the support body is constructed as a unitary member.

17. The apparatus of claim 10, wherein the ground plate is coupled to a bottom surface of the central region and a radially interior surface of the peripheral region.

18. The apparatus of claim 10, wherein the plurality of conductive loops is adjacent to an outer surface of the peripheral region.

19. The apparatus of claim 10, wherein at least a portion of the peripheral region extends towards a chamber bottom.

20. The apparatus of claim 10, wherein the peripheral region surrounds at least a portion of the stem.

* * * * *